United States Patent [19]
Yamamoto et al.

[11] Patent Number: 5,582,215
[45] Date of Patent: Dec. 10, 1996

[54] CERAMIC DIE FOR CUTTING AND SHAPING LEAD FRAMES AND METHOD OF CLEANING THE SAME

[75] Inventors: Takehisa Yamamoto; Takao Nishioka; Akira Yamakawa; Matsuo Higuchi, all of Itami, Japan

[73] Assignee: Sumitomo Electric Industries, Ltd., Japan

[21] Appl. No.: 391,958

[22] Filed: Feb. 21, 1995

[30] Foreign Application Priority Data

Feb. 25, 1994 [JP] Japan ................................. 6-053040
Jan. 23, 1995 [JP] Japan ................................. 7-007852

[51] Int. Cl.⁶ .................................................. B21D 37/01
[52] U.S. Cl. ........................................ 140/105; 72/462
[58] Field of Search ............................ 140/105, 147; 72/462

[56] References Cited

U.S. PATENT DOCUMENTS 5,095,730  3/1992  Lauder ................................. 72/462

FOREIGN PATENT DOCUMENTS 54978  3/1985  Japan ................................. 72/462
48625  2/1989  Japan ................................. 72/462

*Primary Examiner*—Lowell A. Larson
*Attorney, Agent, or Firm*—Bierman and Muserlian

[57] ABSTRACT

A ceramic die for cutting and shaping lead frames, in which at least a working section thereof is made of a specific ceramic material having an iron and cobalt content of less than 100 ppm in total. The ceramic die can be formed in a complex shape with a high precision and has a prolonged lifetime because of its superior mechanical properties, such as high wear resistance and high strength, and less probability of adhesion of foreign matter such as solder or the lead frame material thereto. Even if the solder or lead frame material is adhered onto the die, the adhered matter can be removed through a simple procedure in a shortened time. The die is further improved by depositing a hard carbon film onto the surface of the working section.

17 Claims, 1 Drawing Sheet

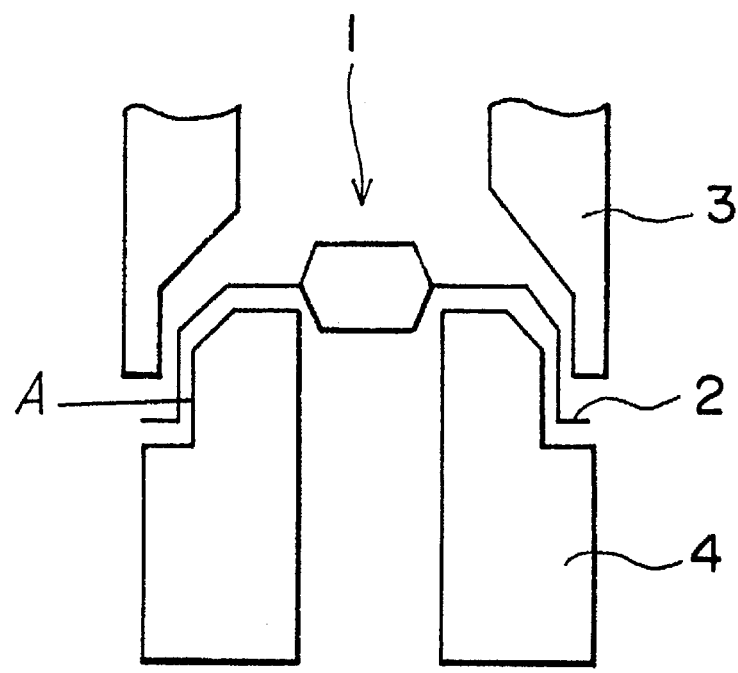

CERAMIC DIE FOR CUTTING AND SHAPING LEAD FRAMES AND METHOD OF CLEANING THE SAME

BACKGROUND OF THE INVENTION

1. Field of the Invention

The present invention relates to a ceramic die for use in cutting and shaping a lead frame with a semiconductor chip mounted thereon in an assembling process for semiconductor devices. More specifically, the present invention relates to a ceramic die for use in cutting a series of tie bars, trimming and/or punching an edge of the lead, and/or bending the lead.

2. Description of the Prior Art

Semiconductor devices are typically assembled through the following process. A semiconductor chip is secured to a lead frame or a package, following which electrodes of the device are interconnected through wires to leads of the lead frame. The frame or the package is then sealed with a resin. Tie bars connecting a plurality of the leads of the lead frames and the lead frames are cut after sealing. Further, cutting and punching of edges of the leads and bending of the leads are performed.

In this assembling process, cutting of the tie bars, cutting and punching of the edges of the leads and bending of the leads are conducted by using a cutting and shaping die. Such a cutting and shaping die is disclosed in, for example, Japanese Patent Laid Open No. 5-82689. The cutting and shaping die comprises a die set and punches with a comb-shaped working section. Conventional cutting and shaping dies for lead frames are typically made of hardened steel or cemented carbide. These materials are subjected to electric discharge machining, following which the materials are subjected to polishing and surface finishing by polishing to form a working section.

However, the dies made of such metal material have a disadvantage dispersion in working precision due to deposition and/or adhesion of debris generated in working the lead frame when cutting and punching soft metal leads consisting mainly of Cu or Al.

In addition, the leads of the lead frame are arranged at a smaller pitch in recent years. The comb-shaped working section of the die thus has teeth with a smaller gap. The die is required to have improved precise working characteristics. Accordingly, there has been a demand on a die material having a high Young's modulus and a low plastic deformation property to inhibit or prevent plastic deformation represented by warping after shaping and other deformation of the material, such as burr, occurring during shaping and trimming. The die is also required to have a high hardness and a superior wear resistance to reduce wearing of the die.

On the other hand, a solder plating used to fix the semiconductor device to a printed wiring board may cause a problem in the conventional die made of the metal material. More specifically, the solder plating may adhere to a surface of the working section of the die. Continuous working of the lead frames with the solder adhered to the surface of the die may cause deformation of the lead such as bending. Such deformation may be a potential cause of inferior soldering, inferior contact, or short-circuit of pins in the subsequent processes. Thus, there may arise problems such that a final product of the semiconductor device operates incorrectly.

With this respect, the die is removed from the machine regularly to remove the adhered solder. In this event, the solder is lapped and then removed. A specific method of cleaning the die is disclosed in, for example, Japanese Patent Laid Open No. 4-280500, in which a brush cleaning or air-blow cleaning mechanism is provided. This mechanism is cooperated with a moving mechanism for the product during bending of an outer lead of the lead frame to remove forcedly the solder adhered to the die. This method using mechanical removal of the solder adhered to the die requires to ensure a sufficient space to attach the mechanism or even modification of the die. The die may be deformed and a lifetime of the die may be reduced.

Japanese Patent Laid Open No. 2-28964 discloses a method of inhibiting adhesion of the solder debris by means of forming grooves in portions of a surface of the bending punch or the bending die where the lead frame contacts. A cost for the die is increased if the grooves are formed in all portions where the solder debris is expected to adhere. In addition, it is difficult to remove the solder debris deposited within the grooves. This makes it necessary to improve the die by the maintenance considerations.

Japanese Patent Laid Open No. 2-134856 discloses a method of depositing a film of amorphous chromium plating having a thickness of from 5 to 10 μm and having superior wear resistance and sliding properties as well as non-adhesion properties on the surface contacting with the lead frame of the die. The film exhibits a weak adhesion to a substrate. Another problem of this method is a rough surface of the film appeared just after formation of the film.

On the other hand, Japanese Patent Nos. 63-203222 and 203223 disclose to use plasma CVD to deposit a film of, for example, $Si_3N_4$, $Al_2O_3$, diamond, or SiC on a surface of a die made of steel or cemented carbide for working metals. Alternatively, Japanese Patent Laid Open No. 64-62468 discloses a method of depositing a hard film of diamond or diamond-like carbon having a thickness of from 0.1 to 10 μm on the surface of a metal or ceramic die, by using the plasma CVD or the like.

However, these films have low adhesion to the substrate and chipping may be caused when a die has a complex configuration and is used under a severe working condition as in working the lead frame. As a result, the lifetime of the die is shortened. In addition, the diamond film has a rough surface. The surface roughness should be improved by other working when this film is used for a die, which disadvantageously takes a long time.

SUMMARY OF THE INVENTION

In view of the foregoing, an object of the present invention is to provide a cutting and shaping die for lead frames which permits improvement of the wear resistance and working a shape of a working section thereof with a high precision.

It is another object of the present invention to provide a cutting and shaping die for lead frames which is less affected by chemical reaction with materials of a lead frame and of solder and permits the removal of the matter deposited and adhered thereto through a simple process.

It is yet another object of the present invention to provide a cutting and shaping die for lead frames having a remarkably longer lifetime than conventional dies made of metal materials.

In order to achieve the above mentioned objects, the present invention provides a ceramic die for cutting and shaping a lead frame on which a semiconductor chip is mounted, wherein at least a working section thereof is made of a ceramic material having an iron and cobalt content of less than 100 ppm in total.

The cutting and shaping ceramic die for lead frames according to the present invention is applicable to a simple cleaning method to remove solder adhered thereto, in which the method comprises treating the die with an aqueous solution of an acid, and treating it with an aqueous solution containing water or an acid corrosion inhibitor.

BRIEF DESCRIPTION OF THE DRAWING

The single FIGURE is a schematic side view of a die used for bending, cutting and shaping a lead frame of a semiconductor device.

DETAILED DESCRIPTION OF THE PREFERRED EMBODIMENTS

Ceramics are superior in wear resistance to metal materials and have a high Young's modulus as well as a high hardness. Such advantageous features of the ceramics permit working with a high precision. Accordingly, the ceramics are more useful than conventional steel materials, especially in pitch precision of a die and a shape maintenance of the edge, and such advantageous properties are effective in working a lead frame. For example, it is possible to improve a pitch precision of the teeth in forming a comb-shape working section of a tie bar cutting die using a diamond cutting wheel. A sharpness of the edge can be improved at a corner of the edge of the working section. The working properties can thus be improved greatly.

A coefficient of thermal expansion of the ceramic is extremely small, so that the die is less or not deformed by heat generated during continuous working of the lead frame. This means that the pitch precision of the comb-shaped working section of the die can be retained, allowing easy and stable retention of the working precision to the lead frame within a desired range for a long time. In addition, it may be possible to increase a working speed because the ceramics are lighter than metals.

The ceramics are chemically stable and are thus less reacted with the solder and lead frame debris. Accordingly, it becomes possible to inhibit adhesion and attachment of the solder and the working debris in working the lead frame. Furthermore, the die made of ceramic is less or not deformed in removing adhesions because of its high wear resistance. In addition, since it has a superior chemical resistance, the adhesions such as the solder can also be removed with chemicals, which is impossible in the conventional art.

In particular, reaction with the solder can be inhibited when the content of iron (Fe) and cobalt (Co) in the ceramic is less than 100 ppm in their total. As a result, adhesion of the solder and the lead frame material can be inhibited. This may eliminate a cleaning process to remove the adhesion, or otherwise, may elongate a working time before cleaning becomes necessary. The above mentioned effects become more remarkable when the content of Fe and Co are less than 50 ppm, and more preferably less than 20 ppm.

Adhesion of the solder, etc., can further be improved when the surface roughness of the working section of the ceramic die is not more than 1 µm in terms of the ten-point mean roughness (Rz) conforming to JIS (Japanese Industrial Standards) B0601. This can be considered to be due to the remarkable appearance of such properties of ceramics that suppress the attack by ceramics having a high Young's modulus and a high hardness to the lead frame or solder plating and prevent the adhesion of the lead frame or solder onto the ceramics. Though depending on the surface conditions of the lead frame or the solder plating, it is possible to further prevent the adhesion of the solder or the like by means of reducing Rz of the ceramic die surface to 0.5 µm or smaller.

A ceramic material used for the ceramic die of the present invention may be, but not limited to, any one as long as it satisfies the above mentioned content of Fe and Co. However, it is preferable to use silicon nitride ($Si_3N_4$) and/or sialon, zirconia ($ZrO_2$), silicon carbide (SIC), or alumina ($Al_2O_3$). These ceramics do not require the above mentioned Fe and Co as sintering aid in the production thereof. In addition, a raw material powder of high purity containing no such elements is readily available. Further, these ceramics are easier than other ceramics to ensure dimension by the grinding, and are less affected by chipping and damage in working. Accordingly, these ceramics can be used advantageously as materials for the die that requires a high dimensional working precision.

It is more preferable to use a ceramic material that has a flexural strength of 100 kg/mm$^2$ or higher, in terms of the three-point bending strength conforming to JIS R1601, and a Charpy impact value of 0.1 kg·m/cm$^2$ or higher. The die receives a large load such as impact in working, so that it can withstand the load applied in working because of such a high flexural strength of 100 kg/mm$^2$ or higher and the Charpy impact value of 0.1 kg·m/cm$^2$ or higher. As a result, it becomes possible to avoid damage, breakage and chipping in working.

The ceramic preferably has a porosity of 3% or lower and a maximum pore size of 20 µm or smaller. With the porosity of higher than 3% or the maximum pore size of larger than 20 µm, the strength may be deteriorated. In addition, the pore may be a cause of adhesion of the solder.

Of these above mentioned ceramics, silicon nitride and/or sialon or zirconia are superior in strength properties as well as toughness. These ceramics are thus preferable in that chipping, breakage, and damage are less or not generated and in that they are unreactive to the solder or lead frame materials.

For the silicon nitride and/or sialon, it is preferable that their content in total is from 88% to 98% by weight, and that β-type silicon nitride and/or sialon has/have an average crystal grain diameter in the major axis of 5 µm or smaller, and more preferably 2.5 µm or smaller. With the silicon nitride and sialon of more than 98% by weight, the strength property is deteriorated while that of less than 88% by weight can provide only insufficient effects in wear resistance and in depression of reactivity with the solder or lead frame materials. With the average crystal grain diameter in the major axis of larger than 5 µm, the strength properties and the wear resistance are deteriorated. In addition, it is preferable that the crystals of silicon nitride and sialon are a mixed crystal phase of α and β types to further improve the strength properties. In this event, it is more preferable that a ratio of α type to α and β types is less than 30%.

When the ceramic material used is zirconia, the material preferably contains from 92% to 99% by weight of zirconia of which average crystal grain diameter is 1.5 µm or smaller. The strength properties may be deteriorated with a zirconia content of higher than 99% by weight. On the other hand, a zirconia content of lower than 92% by weight may provide only insufficient effect in wear resistance and depression of reactivity with the solder or lead frame materials. In addition, the strength and wear resistance properties may be deteriorated when the average crystal grain diameter is larger than 1.5 µm.

By depositing a hard carbon film having a film thickness of from 0.1 to 10 μm, and preferably from 0.3 to 5 μm on the surface of the working section of the ceramic die according to the present invention, adhesion of the solder and the lead frame material onto the die can be suppressed more effectively. In particular, the hard carbon film is adhered more tightly when the Fe and Co content is less than 100 ppm, preferably less than 50 ppm, and more preferably less than 20 ppm. As a result, it becomes possible to exhibit sufficient adhesion inhibiting effects even with a thin film. The term "hard carbon film" used herein means a film containing a diamond-like carbon (DLC), a-C, i-C, a-C:H, or the like.

The hard carbon film has superior slip properties, so that metals such as solder and lead frame materials are less or not adhered thereto. In addition, the smoothness of the surface is extremely high and is less deteriorated due to the high abrasion resistance of the film. Accordingly, the adhesion inhibiting effect can be improved. The hard carbon film has a smaller difference in coefficient of thermal expansion relative to the ceramics. The ceramics used as a substrate is less limited in a temperature condition during film deposition than the metal materials, providing a high adhesion properties.

In this hard carbon film, the surface after film deposition is 1 μm or smaller, and preferably 0.5 μm or smaller in the ten-point mean roughness in order to inhibit adhesion of the solder or the lead frame material. The surface roughness in the above mentioned range may be achieved by selecting a film depositing method and conditions thereof. However, it is preferable that the surface roughness of the ceramic that serves as a substrate is adjusted to 1 μm or lower, and preferably 0.5 μm or lower, in terms of the ten-point mean roughness, on which the film is formed. In addition, this strengthen the adhesion force of the hard carbon film onto the ceramic substrate, further inhibiting stripping of the film.

With the film thickness of the hard carbon film of smaller than 0.1 μm, there is a problem in the durability upon working the lead frame. On the contrary, the film thickness of larger than 10 μm, it becomes difficult to keep the dimensional precision upon deposition of the film. In addition, it takes a long time for such film deposition, which is disadvantageous by the industrial considerations. The film thickness is preferably in a range from 0.3 to 5 μm because that of 0.3 μm or larger provides a sufficient durability against possible damages in maintenance while that of 5 μm or smaller can be deposited for a shorter time.

There is no limitation on a method of depositing the hard carbon film, so that ion plating, sputtering, plasma CVD, or the like may be used. The dies are, however, typically complex in shape, so that it is preferable that film depositing conditions including a temperature and a degree of vacuum are optimized along with optimizing pre-processing such as cleaning of a surface, on which the film is to be deposited, depending on the configuration of each die in order to improve the adhesion force of the film.

There is no specific limitation on the ceramic used as the substrate as long as the content of Fe and Co is lower than 100 ppm. It is, however, preferable to use silicon nitride and/or sialon, nitrides such as silicon nitride and carbides in having a small amount of oxygen in the surface that dominates the adhesion force.

In particular, when the hard carbon film is deposited on a high-strength ceramic having the above mentioned three-point flexural strength of 100 kg/mm$^2$ or higher, the Charpy impact value of 0.1 kg·m/cm$^2$ or larger, the porosity of 3% of lower, and the maximum pore size of 20 μm or smaller, the surface roughness of the film becomes small and the adhesion force is improved. Commercially available ceramics have a large number of pores of 30–50 μm, and even of more than 100 μm, in the surface thereof. Since there is a difficulty in film deposition around the pores, a film cannot be deposited locally or has a portion where the adhesion force is low. On the contrary, the above mentioned inventive high-strength ceramic has a less number of pores and is thus free from the above mentioned troubles.

The above mentioned ceramic die of the present invention can suppress adhesion of the solder and the lead frame material as mentioned above. In addition, the adhesions, if any, can be removed readily through, for example, chemical treatment due to the good chemical stability of the ceramics and the hard carbon film. Accordingly, the productivity can be improved significantly as compared with conventional arts in which the die is periodically removed for working such as lapping.

Specific cleaning method is conducted as follows, in order to remove the adhered matter such as the solder attached in continuous working of the lead frame. The die is treated with an aqueous solution of an acid that is capable of dissolving the adhered matter. The acid used is preferably hydrochloric acid, sulfuric acid, or nitric acid because of its acceptable cost and easy availability. Alternatively, a mixture of these acid may be used. A concentration of the acid in the solution is determined adequately in a range of from 10% to 90% by weight considering the type of the acid used and the amount of the adhesion.

This acidic solution is preferably at or around a room temperature to avoid corrosion of other parts due to diffusion of the acid. However, it is possible to increase a rate of removing the adhered matter when the solution is heated to approximately 80° C. In addition, there is no limitation on a method to apply the aqueous solution of the acid to the die. For example, the aqueous solution of the acid may be used to remove the adhered matter by using a brush or cloth impregnated therewith. Alternatively, the aqueous solution of the acid may be sprayed with a nozzle.

After completion of the treatment with the aqueous solution of the above mentioned acid, the die is then treated with water or an aqueous solution containing an acid corrosion inhibitor in order to prevent acid remaining in the die from adhering onto the lead frame. Further, it is possible to remove water remaining in the die when the die is treated with an organic solvent such as acetone and alcohol. Examples of the acid corrosion inhibitor include commercially available polyamine derivatives.

During the above mentioned cleaning treatment, the air is preferably ventilated by means of disposing a duct near the die to avoid corrosion of the metal components by the evaporated acid and avoid the evaporated acid corrosion inhibitor or organic solvents from affecting operators.

EXAMPLE 1

With each material of the commercially available steel, cemented carbide, and various ceramic materials, as shown in Table 1 below, a tie bar cutting die for a lead frame was produced using a diamond cutting wheel in which a lateral width, length, and thickness of the teeth of the working section were 0.45 mm, 3.8 mm, and 0.9 mm, respectively. A pitch between the adjacent comb-teeth centers was 1.2 mm, and the number of the teeth was 25. The comb at the edge of the die was processed with a diamond cutting wheel with a resin or a metal bond at a cutting wheel speed of 40–100 m/sec., a vibration amplitude in lateral and circumference directions of the cutting wheel in rotation of 0.5 μm or smaller (detected by using an optical sensor), a feeding rate of the die material of 40–100 m/min., and a cutting rate of 0.5–3 m/min. The working was made through a plunge cutting of a reciprocation type.

Table 1 shows the Fe and Co contents (wt. %), the three-point flexural strength (kg/mm$^2$) in accordance with JIS R1601, the Charpy impact value (kg·m/cm$^2$), the porosity (%) and the maximum pore size (μm) of the ceramic materials. The porosity was calculated out from a difference between a theoretical density and an actual density. The maximum pore size was calculated as follows. Any two-dimensional sections were mirror-lapping treated to 0.1 μm or smaller in the ten-point mean roughness according to JIS B0601. The roughness was determined through optical microscopy for the field of 500 μm×500 μm.

The dies obtained were used for assessment of the die lifetime by cutting the tie bars of Cu-based lead frames. The die lifetime was determined at the point when the chipping or wearing was 50% or more of the thickness of the teeth. The number of working shots before that time was assessed by a relative comparison based on a steel die (sample 1). The results are given in Table 1 below.

TABLE 1

| Sample No. | Die material | Content (wt. %) Fe | Content (wt. %) Co | Flexural strength (kg/mm$^2$) | Charpy impact (kg·m/cm$^2$) | Porosity (%) | Max. pore (μm) | Life time Assessment |
|---|---|---|---|---|---|---|---|---|
| 1* | Steel | 85 | 1 | — | — | — | — | 1 |
| 2* | Cemented carbide | 1 | 1 | 280 | 0.52 | 0.1 | 10 | 1.1 |
| 3* | Si$_3$N$_4$ | 1.2 | 0.001 | 80 | 0.03 | 1.2 | 28 | 1.2 |
| 4* | Si$_3$N$_4$ | 0.02 | 0.001 | 80 | 0.03 | 1.2 | 28 | 1.3 |
| 5 | Si$_3$N$_4$ | 0.005 | 0.001 | 80 | 0.03 | 1.2 | 28 | 1.8 |
| 6 | Si$_3$N$_4$ | 0.005 | 0.001 | 130 | 0.13 | 0.8 | 13 | 2.0 |
| 7 | Si$_3$N$_4$ | 0.001 | 0.001 | 130 | 0.13 | 0.8 | 13 | 2.4 |
| 8 | Si$_3$N$_4$ | <0.001 | <0.001 | 160 | 0.17 | 0.6 | 11 | 3.1 |
| 9 | ZrO$_2$ | 0.001 | 0.002 | 200 | 0.32 | 0.2 | 5 | 2.9 |

(note) Samples with * in Table 1 are comparative examples.

TABLE 2

| Sample No. | Die material | Content (wt. %) Fe | Content (wt. %) Co | Rz (μm) | Distribution of precision (mm) Average | Distribution of precision (mm) Max |
|---|---|---|---|---|---|---|
| 10* | Steel | 85 | 4 | 0.8 | 0.33 | 0.38 |
| 11* | Cemented carbide | 0 | 5 | 0.8 | 0.28 | 0.35 |
| 12* | Cemented carbide | 1 | 1 | 0.8 | 0.25 | 0.28 |
| 13* | Si$_3$N$_4$ | 1.2 | 0.01 | 0.8 | 0.27 | 0.32 |
| 14* | Si$_3$N$_4$ | 0.02 | 0.01 | 0.8 | 0.22 | 0.25 |
| 15 | Si$_3$N$_4$ | 0.005 | 0.003 | 0.8 | 0.14 | 0.18 |
| 16 | Si$_3$N$_4$ | 0.002 | 0.002 | 0.8 | 0.09 | 0.13 |
| 17 | Si$_3$N$_4$ | <0.001 | <0.001 | 0.8 | 0.05 | 0.09 |
| 18 | Si$_3$N$_4$ | 0.005 | 0.003 | 0.5 | 0.18 | 0.22 |
| 19 | Si$_3$N$_4$ | 0.005 | 0.003 | 0.2 | 0.06 | 0.10 |
| 20 | sialon | 0.008 | 0.001 | 0.8 | 0.14 | 0.17 |
| 21 | SiC | 0.005 | 0.003 | 0.8 | 0.14 | 0.20 |
| 22 | Al$_2$O$_3$—TiC | 0.004 | 0.003 | 0.8 | 0.20 | 0.23 |
| 23 | Al$_2$O$_3$ | 0.006 | 0.003 | 0.8 | 0.15 | 0.18 |
| 24 | ZrO$_2$ | 0.005 | 0.003 | 0.8 | 0.15 | 0.19 |
| 25 | Al$_2$O$_3$—SiC | 0.005 | 0.003 | 0.8 | 0.20 | 0.23 |

(note) Samples with * in Table 2 are comparative examples.

The above mentioned results indicate that to use a die of ceramic material having the Fe and Co contents of less than 100 ppm improved the wear resistance of the die. Also, it can be seen that lifetime is also elongated even in the tie bar cutting die with a smaller comb-teeth pitch and the punching shaping of the lead frame can be continuously made with a high precision for a long time.

EXAMPLE 2

With a die comprising a bending die 4 and a punch 3 illustrated in the FIGURE, a lead frame 2 of a semiconductor device 1 was subjected to bending working. The die was prepared with each of the following materials given in Table 2. The ceramic materials used in each die had the properties as shown in Table 3.

With each of these dies, 4,000 semiconductor devices having Cu-based lead frames subjected to solder plating were continuously subjected to bending. A distribution of the precision of the lead distance (average and maximum) was determined. The results are given in Table 2. The ten-point mean roughness Rz illustrated in Table 2 was a value measured for a section A of the bending die 4 of the die illustrated in the FIGURE.

TABLE 3

| Material used | Flexural strength (kg/mm$^2$) | Charpy impact (kg·m/cm$^2$) | Porosity (%) | Max. pore (μm) |
|---|---|---|---|---|
| Si$_3$N$_4$ | 115 | 0.127 | 1.3 | 19 |
| Sialon | 102 | 0.105 | 0.9 | 18 |
| SiC | 58 | 0.011 | 3.4 | 32 |
| Al$_2$O$_3$—TiC | 90 | 0.018 | 3.2 | 26 |
| Al$_2$O$_3$ | 73 | 0.017 | 1.6 | 18 |
| ZrO$_2$ | 186 | 0.232 | 0.4 | 10 |
| Al$_2$O$_3$—SiC | 86 | 0.020 | 2.6 | 25 |

The above mentioned results indicated that the ceramic materials, particularly silicon nitride, sialon, zirconia, silicon carbide, and alumina, are more preferable than conventional steel or cemented carbide materials. In addition, comparison of samples 13–17 indicated that reduction of Fe and Co amounts in the ceramic die to less than 100 ppm, less than 50 ppm, and less than 20 ppm inhibited adhesion of the solder and provides working of a high precision. In addition, samples 15, 18 and 19 indicated that the smaller Rz of the surface of the working section was, the more the adhesion inhibiting effect of the solder was manifested.

EXAMPLE 3

With the die made of each material given in Table 4 below, Example 2 was repeated for bending continuously semiconductor devices having Cu-based lead frames plated with the solder to assess the lifetime of the die. The number of the workings required before the cleaning due to the adhered matters was used for the assessment of the lifetime. The number of workings for sample 26 was used as a reference for relative comparison. Rz of the surface of the die was compiled to less than 0.2 μm. The porosity and the maximum pore size were measured in the same manner as in Example 1.

A crystal grain diameter (μm) of the ceramic materials in Table 5 was an average obtained by means of mirror-lapping and chemical etching working any two-dimensional sections, following which any 50 μm×50 μm fields were observed through SEM for the chemically etched surfaces, and by measuring the diameter of any 50 crystal grains. The content of Fe and Co in the ceramic materials was adjusted to less than 10 ppm, while the Rz of the die surface was set to less than 0.2 μm.

For $ZrO_2$, one kind of powder of yttrium, magnesia, calcia, and alumina was added as a sintering aid to a powdery raw material of $ZrO_2$ having an average particle diameter of 0.6 μm or smaller and a BET value of 12–18

TABLE 4

| Sample No. | Die material | Content (ppm) Fe | Content (ppm) Co | Flexural strength (kg/mm$^2$) | Charpy impact (kg · m/cm$^2$) | Porosity (%) | Max. pore (μm) | Life time Assessment |
|---|---|---|---|---|---|---|---|---|
| 26* | Cemented carbide | 1 | 1 | 280 | 0.52 | 0.1 | 10 | 1 |
| 27 | SiC | 50 | 20 | 58 | 0.011 | 3.4 | 32 | 1.2 |
| 28 | $Al_2O_3$—TiC | 10 | 10 | 90 | 0.018 | 3.2 | 26 | 1.4 |
| 29 | $Al_2O_3$ | 50 | 30 | 43 | 0.012 | 2.8 | 20 | 1.3 |
| 30 | $Si_3N_4$ | <10 | <10 | 83 | 0.072 | 1.3 | 28 | 1.5 |
| 31 | Sialon | <10 | <10 | 102 | 0.105 | 0.9 | 18 | 2.0 |
| 32 | $Si_3N_4$ | <10 | <10 | 156 | 0.162 | 0.3 | 11 | 2.5 |
| 33 | $ZrO_2$ | 30 | 20 | 186 | 0.232 | 0.4 | 10 | 2.2 |

(note) A samples with * in Table 4 is a comparative example.

These results indicated that the dies made of the ceramic materials were subjected to less chipping and damages, and resulted in a prolonged lifetime of the die. In particular, the lifetime of the die was overwhelmingly elongated in the die made of the ceramic material having the three-point flexural strength in accordance with JIS R1601 of 100 kg/mm$^2$ or higher, the Charpy impact value of 0.1 kg·m/cm$^2$ or larger, the porosity of 3% or lower, and the maximum pore size of 20 μm or smaller.

EXAMPLE 4

Example 3 was repeated to assess the lifetime of the die made of each ceramic material given in Table 5. The results are given in Table 5. The lifetime assessment was made by relative comparison with a reference of the number of workings for the sample 1 in the above mentioned Example 3.

m$^2$/g. The mixture was heated in the air or in vacuo at a rate of 2°–15° C./min and then sintered for 1–6 hours at 1350°–1700° C. In addition, samples 36–38 were subjected to HIP process (hot isostatic pressing process), after sintering, in an argon atmosphere of 1000 arm at 1350°–1700° C. for 1 hour.

For $Si_3N_4$ and sialon, one or more kinds of powder of yttrium, magnesia, titania, alumina and aluminum nitride were added as a sintering aid to a powdery raw material ($Si_3N_4$ and sialon) having an average particle diameter of 0.7 μm or smaller and a BET value of 10–15 m$^2$/g. The mixture was heated in a nitrogen atmosphere of 1–9.8 atm. at a heating rate of 5°–15° C./min and then sintered for 1–6 hours at 1500°–1800° C. In addition, samples 41–45, and 49–52 were subjected to HIP processing, after sintering, in a nitrogen atmosphere of 1000 arm at 1500°–1700° C. for 1 hour. Samples 43–45, 49, and 50 were sintered bodies having a mixed crystal phase of β-$Si_3N_4$ or β'-sialon and α-$Si_3N_4$ or α'-sialon.

TABLE 5

| Sample No. | Die material | Main component (wt. %) | Crystal grain diameter (μm) | Flexural strength (kg/mm$^2$) | Charpy impact (kg · m/cm$^2$) | Porosity (%) | Max. pore (μm) | Life time Assessment |
|---|---|---|---|---|---|---|---|---|
| 34 | $ZrO_2$ | 90 | 0.9 | 93 | 0.09 | 2.1 | 25 | 1.4 |
| 35 | $ZrO_2$ | 99.5 | 1.8 | 85 | 0.08 | 2.5 | 18 | 1.6 |
| 36 | $ZrO_2$ | 92 | 0.5 | 142 | 0.17 | 0.6 | 18 | 2.2 |
| 37 | $ZrO_2$ | 93 | 0.4 | 169 | 0.19 | 0.8 | 8 | 2.4 |
| 38 | $ZrO_2$ | 95 | 0.4 | 205 | 0.32 | 0.2 | 25 | 2.4 |
| 39 | $Si_3N_4$ | 86 | 2.4 | 95 | 0.04 | 1.8 | 30 | 1.6 |
| 40 | $Si_3N_4$ | 99 | 5.4 | 73 | 0.02 | 2.6 | 14 | 1.5 |
| 41 | $Si_3N_4$ | 92 | 1.8 | 132 | 0.13 | 0.8 | 12 | 2.3 |
| 42 | $Si_3N_4$ | 92 | 4.8 | 124 | 0.13 | 0.7 | 25 | 2.1 |
| 43 | $Si_3N_4$ | 94 | 1.3 | 160 | 0.19 | 0.6 | 8 | 2.6 |
| 44 | $Si_3N_4$ | 94 | 2.3 | 152 | 0.18 | 0.7 | 10 | 2.5 |
| 45 | $Si_3N_4$ | 96.5 | 1.5 | 145 | 0.17 | 0.6 | 11 | 2.4 |
| 46 | Sialon | 82 | 2.5 | 90 | 0.03 | 1.9 | 26 | 1.5 |

TABLE 5-continued

| Sample No. | Die material | Main component (wt. %) | Crystal grain diameter (μm) | Flexural strength (kg/mm²) | Charpy impact (kg·m/cm²) | Porosity (%) | Max. pore (μm) | Life time Assessment |
|---|---|---|---|---|---|---|---|---|
| 47 | Sialon | 99.5 | 8.6 | 65 | 0.02 | 2.8 | 32 | 1.4 |
| 48 | Sialon | 92 | 1.9 | 115 | 0.12 | 0.9 | 14 | 2.1 |
| 49 | Sialon | 94 | 1.5 | 172 | 0.18 | 0.8 | 8 | 2.7 |
| 50 | Sialon | 96 | 1.7 | 156 | 0.16 | 0.8 | 12 | 2.5 |
| 51 | Sialon | 94 | 4.5 | 126 | 0.14 | 0.7 | 13 | 2.2 |
| 52 | Sialon | 96 | 2.2 | 154 | 0.12 | 0.6 | 8 | 2.5 |

(note) The crystal grain diameter of samples 39–52 are average grain size determined along the major axis.

The above mentioned results indicated that the resultant die had superior strength properties and wear resistance when the ceramic material contained 88–98% by weight in total of $Si_3N_4$ and/or sialon, and when the average crystal grain diameter of $\beta$-$Si_3N_4$ or sialon in the major axis was 5 μm or smaller, improving the lifetime of the die. In addition, the lifetime of the die was further elongated by the same reason when the ceramic material contained 92–99% by weight of $ZrO_2$ and the average crystal grain diameter of $ZrO_2$ was 1.5 μm or smaller.

EXAMPLE 5

Example 3 was repeated to assess the lifetime of the die with the dies made of the following materials in Table 6 provided with a hard carbon film. The results are given in Table 6. The lifetime was assessed through relative comparison with a reference of the number of the workings in sample 1 in Example 3. The ten-point mean roughness Rz was measured at the A portion illustrated in the FIGURE as in Example 2. The columns of the substrate and film surface in Table 6 represent the surface roughness of the substrate before deposition of the film and the surface roughness of the hard carbon film, respectively. Properties of the materials used are given in Table 7.

The hard carbon film was deposited through plasma CVD by using a high-frequency discharge. First, the die was washed with a surfactant and an organic solvent to remove contaminants on the surface of the die. The die was then subjected to ion cleaning in a film depositing device. The ion cleaning was made by means of introducing an Ar gas to 0.2 Torr into a device deaerated to $5 \times 10^{-6}$ Torr. Discharge was then generated by using a high-frequency power supply of 13.56 MHz for cleaning for 5 minutes. The device was again deaerated to $5 \times 10^{-6}$ Torr, following which methane gas was introduced thereinto up to 0.2 Torr. Discharge was then generated by using the high-frequency power supply to deposit the hard carbon film.

TABLE 6

| Sample No. | Die material | Content (wt. %) Fe | Content (wt. %) Co | Film thickness (μm) | Rz (μm) Substrate | Rz (μm) Film surface | Life time Assessment |
|---|---|---|---|---|---|---|---|
| 53* | Cemented carbide | 1 | 1 | 1 | 0.2 | 0.1 | 1.2 |
| 54 | $Si_3N_4$(a) | 1.2 | 0.01 | 1 | 0.2 | 0.1 | 1.2 |
| 55 | Sialon | <0.001 | <0.001 | 0.05 | 0.2 | 0.1 | 2.5 |
| 56 | Sialon | <0.001 | <0.001 | 0.1 | 0.2 | 0.1 | 3.0 |
| 57 | Sialon | <0.001 | <0.001 | 0.3 | 0.2 | 0.1 | 3.4 |
| 58 | Sialon | <0.001 | <0.001 | 1 | 0.2 | 0.1 | 4.1 |
| 59 | Sialon | <0.001 | <0.001 | 5 | 0.2 | 0.1 | 4.0 |
| 60 | Sialon | <0.001 | <0.001 | 10 | 0.2 | 0.1 | 3.6 |
| 61 | Sialon | <0.001 | <0.001 | 12 | 0.2 | 0.1 | 2.5 |
| 62 | Sialon | 0.002 | 0.001 | 1 | 0.2 | 0.1 | 3.7 |
| 63 | Sialon | 0.005 | 0.003 | 1 | 0.2 | 0.1 | 3.3 |
| 64 | Sialon | 0.01 | 0.005 | 1 | 0.2 | 0.1 | 2.6 |
| 65 | $Si_3N_4$(b) | 0.005 | 0.003 | 1 | 0.2 | 0.1 | 3.3 |
| 66 | $Si_3N_4$(b) | 0.005 | 0.003 | 2 | 0.8 | 0.2 | 3.1 |
| 67 | $Si_3N_4$(b) | 0.005 | 0.003 | 3 | 1.5 | 0.2 | 2.9 |
| 68 | $Si_3N_4$(b) | 0.005 | 0.003 | 2 | 1.5 | 0.8 | 2.6 |
| 69 | $Si_3N_4$(b) | 0.005 | 0.003 | 0.8 | 1.5 | 1.2 | 2.2 |
| 70 | SiC | 0.005 | 0.001 | 1 | 0.1 | 0.1 | 1.5 |
| 71 | $Al_2O_3$ | 0.003 | 0.003 | 1 | 0.2 | 0.1 | 1.4 |
| 72 | $ZrO_2$ | 0.001 | 0.002 | 1 | 0.2 | 0.1 | 2.6 |

(note) A sample with * in Table 6 is a comparative example.

TABLE 7

| Material used | Flexural strength (kg/mm²) | Charpy impact (kg·m/cm²) | Porosity (%) | Max. pore (μm) |
|---|---|---|---|---|
| Cemented carbide | 280 | 0.52 | 0.1 | 10 |
| $Si_3N$(a) | 73 | 0.068 | 3.3 | 35 |
| $Si_3N$(b) | 132 | 0.13 | 0.8 | 14 |
| Sialon | 153 | 0.12 | 0.8 | 12 |
| SiC | 72 | 0.015 | 1.6 | 18 |
| $Al_2O_3$ | 43 | 0.012 | 2.3 | 20 |
| $ZrO_2$ | 186 | 0.232 | 0.4 | 10 |

These results indicated that the hard carbon film deposited on the surface of the working section of the ceramic die inhibited the adhesion of the solder or the like, elongating the lifetime of the die. In particular, comparison of samples 55–61 indicated that the durability of the film was further improved to provide a more effective result by controlling the film thickness of the hard carbon film to a range from 0.1 to 10 μm.

In addition, comparison of samples 58 and 62–64 indicates that the adhesion properties of the film is improved and the durability is also improved when the content of Fe and Co in the ceramic substrate is less than 100 ppm, preferably less than 50 ppm, and more preferably less than 20 ppm. Further, it is clear from the test results of samples 65–67 that more advantageous effects can be obtained when the surface roughness of the ceramic substrate is 1 μm or lower, and preferably 0.5 μm or lower in Rz. Moreover, the results of samples 67–69 show that better results can be obtained, when the surface roughness of the film is 1 μm or lower, and preferably 0.5 μm or lower.

EXAMPLE 6

With the die made of steel, cemented carbide, silicon nitride, sialon, alumina, silicon carbide, alumina-titanium carbide, zirconia, and sialon provided with a hard carbon film, lead frames of the semiconductor device were continuously trimmed and processed as shown in the FIGURE. At the time when the die required maintenance due to adhesion of the solder, the die was cleaned to remove the adhered matter with a 35%-hydrochloric acid solution, 12%-hydrochloric acid solution, 10%-nitric acid solution, or 80%-sulfuric acid solution. Thereafter, the die was washed with an acid corrosion inhibiting agent containing 1% by weight solution of polyamine derivative.

As a result, the dies made of steel and cemented carbide were deformed due to corrosion. On the contrary, other dies made of ceramic or ceramic with the hard carbon film were not subjected to serious, corrosion, and the adhered matter could be removed completely. In addition, the time required for removing the adhered matter with the acidic solution and for treating with the acid corrosion inhibiting agent was approximately 1/10 the time required for removing adhered matter by means of the conventional lapping treatment.

In addition, the dies were treated with the acid corrosion inhibiting agent after treatment with the acid solution in the above examples. However, when water was used rather than the acid corrosion inhibiting agent, slight corrosion was observed such that the surface of the trimmed and shaped lead frame was clouded.

When the concentration of the acid solution was lower than 10%, it was difficult to remove the adhered matter such as the solder completely. In addition, when the ceramic material contained Fe and Co of 100 ppm or more, corrosion was observed at the edge of the ceramic die.

These results indicated that, in the dies made of a ceramic material having a total content of Fe and Co of less than 100 ppm or those provided with the hard carbon film, the acid solution can be used advantageously to remove chemically and readily the adhered matter such as the solder for a short time. In addition, it is possible to avoid corrosion of the die and the lead frame by means of washing them with water or the acid corrosion inhibiting agent without deforming the die.

As mentioned above, according to the present invention, it is possible to achieve a high-precision working of the working section while improving the wear resistance of the die. In addition, it is possible to inhibit chemical reaction of a die with the lead frame material and the solder material. Further, it is also possible to inhibit adhesion of these materials to the surface of the die. In this way, the present invention is applicable to provide a cutting and shaping ceramic die having a long lifetime that is capable of maintaining the working precision for a long time.

Moreover, the ceramic die of the present invention permits removal of the adhered matter such as the solder through a simple, chemical method for a short time. In addition, it permits elongation of the lifetime as well as improvement of the wear resistance. Moreover, it becomes possible to improve working efficiency for cutting and shaping a lead frame while improving the productivity.

What is claimed is:

1. A ceramic die for cutting and shaping a lead frame on which a semiconductor chip is mounted, wherein at least a working section thereof is made of a ceramic material having an iron and cobalt content of less than 100 ppm in total.

2. A ceramic die as claimed in claim 1, wherein the working section made of the ceramic material has a surface roughness of 1 μm or lower in terms of the ten-point mean roughness according to JIS B0601.

3. A ceramic die as claimed in claim 2, wherein the ceramic material is silicon nitride and/or sialon, zirconia, silicon carbide, or alumina.

4. A ceramic die as claimed in claim 3, wherein the ceramic material has a flexural strength of 100 kg/mm$^2$ or higher in terms of the three-point flexural strength according to JIS R1601, a Charpy impact value of 0.1 kg·m/cm$^2$ or larger, a porosity of 3% or lower, and a maximum pore diameter of 20 μm or smaller.

5. A ceramic die as claimed in claim 4, wherein the ceramic material contains 88–98% by weight in total of silicon nitride and/or sialon, in which β-type silicon nitride and/or sialon has an average crystal grain diameter of 5 μm or smaller in the major axis direction thereof.

6. A ceramic die as claimed in claim 4, wherein the ceramic material contains 92–99% by weight of zirconia, in which zirconia having an average crystal grain diameter of 1.5 μm or smaller.

7. A ceramic die as claimed in claim 3, wherein the ceramic material contains 88–98% by weight in total of silicon nitride and/or sialon, in which β-type silicon nitride and/or sialon has an average crystal grain diameter of 5 μm or smaller in the major axis direction thereof.

8. A ceramic die as claimed in claim 4, wherein the ceramic material contains 92–99% by weight of zirconia, in which zirconia having an average crystal grain diameter of 1.5 μm or smaller.

9. A ceramic die as claimed in claim 1, wherein the ceramic material is silicon nitride and/or sialon, zirconia, silicon carbide, or alumina.

10. A ceramic die as claimed in claim 9, wherein the ceramic material has a flexural strength of 100 kg/mm$^2$ or higher in terms of the three-point flexural strength according to JIS R1601, a Charpy impact value of 0.1 kg·m/cm$^2$ or larger, a porosity of 3% or lower, and a maximum pore diameter of 20 μm or smaller.

11. A ceramic die as claimed in claim 10, wherein the ceramic material contains 88–98% by weight in total of silicon nitride and/or sialon, in which β-type silicon nitride and/or sialon has an average crystal grain diameter of 5 μm or smaller in the major axis direction thereof.

12. A ceramic die as claimed in claim 5, wherein the ceramic material contains 92–99% by weight of zirconia, in which zirconia having an average crystal grain diameter of 1.5 μm or smaller.

13. A ceramic die as claimed in claim 9, wherein the ceramic material contains 88–98% by weight in total of silicon nitride and/or sialon, in which β-type silicon nitride and/or sialon has an average crystal grain diameter of 5 μm or smaller in the major axis direction thereof.

14. A ceramic die as claimed in claim 9, wherein the ceramic material contains 92–99% by weight of zirconia, in which zirconia having an average crystal grain diameter of 1.5 μm or smaller.

15. A ceramic die as claimed in claim 1, wherein a hard carbon film having a thickness of 0.1–10 μm is deposited on a surface of the working section made of the ceramic material.

16. A method of cleaning for removing adhered matter from a ceramic die for cutting and shaping a lead frame on which a semiconductor chip is mounted, wherein the method comprising: treating, with an acidic solution, a ceramic die made of a ceramic material having a content of iron and cobalt in total of less than 100 ppm in at least a working section thereof, or the ceramic die provided with a hard carbon film having a film thickness of 0.1–10 μm thereon; and treating the die with water or an aqueous solution containing an acid corrosion inhibitor.

17. A method as claimed in claim 16, wherein the acidic solution is an aqueous solution containing 10–90% by weight of hydrochloric acid sulfuric acid, or nitric acid.

* * * * *